US012805231B2

(12) United States Patent
Zalkovskij

(10) Patent No.: US 12,805,231 B2
(45) Date of Patent: Nov. 17, 2026

(54) MULTI-LEVEL STRUCTURE FABRICATION

(71) Applicant: NILT Switzerland GmbH, Horgen (CH)

(72) Inventor: Maksim Zalkovskij, Copenhagen (DK)

(73) Assignee: NILT Switzerland GmbH, Horgen (CH)

( * ) Notice: Subject to any disclaimer, the term of this patent is extended or adjusted under 35 U.S.C. 154(b) by 238 days.

(21) Appl. No.: 18/288,270

(22) PCT Filed: Apr. 12, 2022

(86) PCT No.: PCT/EP2022/059788
§ 371 (c)(1),
(2) Date: Oct. 25, 2023

(87) PCT Pub. No.: WO2022/228892
PCT Pub. Date: Nov. 3, 2022

(65) Prior Publication Data
US 2024/0203748 A1 Jun. 20, 2024

Related U.S. Application Data

(60) Provisional application No. 63/179,741, filed on Apr. 26, 2021.

(51) Int. Cl.
*H10P 50/00* (2026.01)

(52) U.S. Cl.
CPC ............ *H10P 50/73* (2026.01); *H10P 50/692* (2026.01); *H10P 50/695* (2026.01)

(58) Field of Classification Search
None
See application file for complete search history.

(56) References Cited

U.S. PATENT DOCUMENTS

2016/0099380 A1 4/2016 Lai et al.
2016/0365276 A1 12/2016 Wu et al.
(Continued)

FOREIGN PATENT DOCUMENTS

WO WO 2020/185954 9/2020
WO WO-2020185954 A1 * 9/2020 ....... B29D 11/00769

OTHER PUBLICATIONS

International Preliminary Report on Patentability in International Appln. No. PCT/EP2022/059788, mailed on Nov. 9, 2023, 11 pages.
(Continued)

*Primary Examiner* — Stephanie P Duclair
(74) *Attorney, Agent, or Firm* — Fish & Richardson P.C.

(57) ABSTRACT

A substrate (200) is provided having a multi-layer structure (202) disposed thereon. The multi-layer structure includes a plurality of meta-layers, each meta-layer including a hard mask layer (206*a-d*) including a hard mask material, and a spacer layer (208*a-c*) on which the hard mask layer is disposed, the spacer layer including a spacer material. A replication material is disposed on a surface of the multi-layer structure. A replication pattern including a first replication feature (212*a*) and a second replication feature (212*b*, 212*c*) is imprinted into the replication material. The first replication feature and the second replication feature have different heights. A plurality of etching processes are performed on the replication material, the multi-layer structure, and the substrate, to obtain a substrate pattern including a first substrate feature and a second substrate feature.

20 Claims, 12 Drawing Sheets

(56) References Cited

U.S. PATENT DOCUMENTS

| | | | | |
|---|---|---|---|---|
| 2017/0068025 | A1* | 3/2017 | Ockenfuss ............ | H10F 39/806 |
| 2021/0082697 | A1 | 3/2021 | De Silva et al. | |

OTHER PUBLICATIONS

International Search Report and Written Opinion in International Appln. No. PCT/EP2022/059788, mailed on Aug. 16, 2022, 16 pages.

* cited by examiner

FIG. 1D
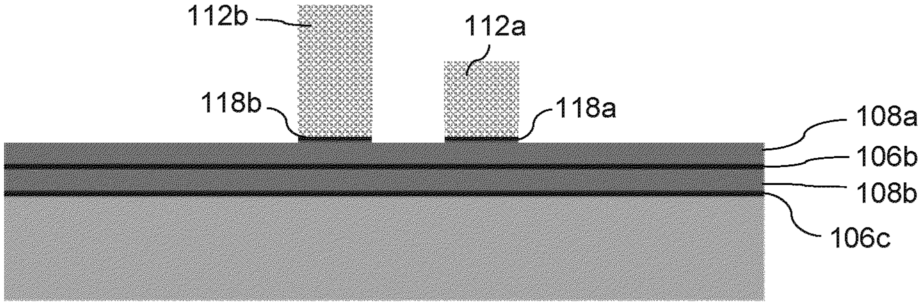
FIG. 1E
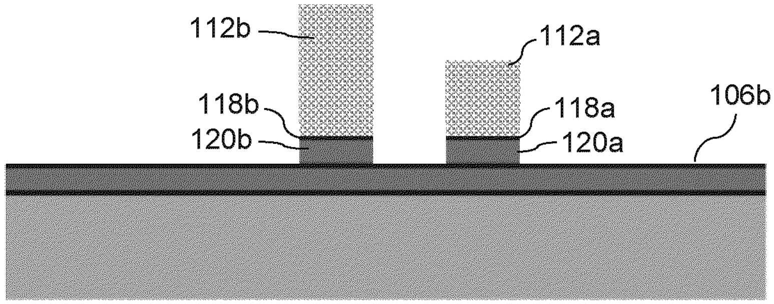
FIG. 1F
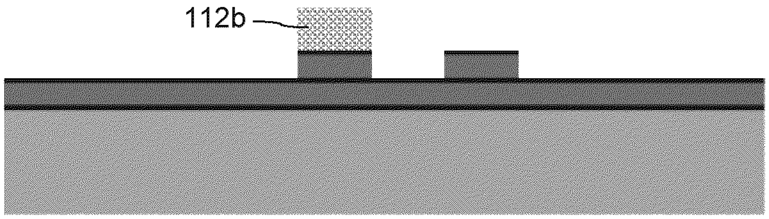

212c
212b
212a
216
202
200
206a
208a
206b
208b
206c
208c
206d
1) Etch residual replication layer
2) Etch hard mask layer 212c
212b
212a
1) Etch spacer layer
2) Partially etch replication material 212c
212b
Etch hard mask layer 212c
212b
1) Etch spacer layer
2) Partially etch replication material 212c
214c
214b
214a

MULTI-LEVEL STRUCTURE FABRICATION

CROSS-REFERENCE TO RELATED APPLICATIONS

This application is a National Stage application under 35 U.S.C. § 371 of International Application No. PCT/EP2022/059788, filed on Apr. 12, 2022, which claims the benefit of priority from U.S. Provisional Patent Application No. 63/179,741, filed on Apr. 26, 2021, the contents and disclosures of which are incorporated herein by reference in their entirety.

FIELD OF THE DISCLOSURE

The present disclosure relates to the fabrication of optical and other structures.

BACKGROUND

In a replication process, a given structure or a negative thereof is reproduced. In some cases, a structure is reproduced in a replication material disposed on a substrate. Structures created by replication may serve various functions, including structures that act as optical elements such as a lens, lens array, beam splitter, diffuser, polarizer, bandpass filter, or other optical element.

SUMMARY

In some aspects, the present disclosure describes methods. In one aspect, the disclosure describes a method including providing a substrate having a multi-layer structure disposed thereon. The multi-layer structure includes a plurality of meta-layers, each meta-layer including a hard mask layer including a hard mask material, and a spacer layer on which the hard mask layer is disposed, the spacer layer including a spacer material. A replication material is disposed on a surface of the multi-layer structure. The method includes imprinting, into the replication material, a replication pattern including a first replication feature and a second replication feature. The first replication feature and the second replication feature have different heights. The method includes performing a plurality of etching processes on the replication material, the multi-layer structure, and the substrate, to obtain a substrate pattern including a first substrate feature and a second substrate feature. The first substrate feature is aligned with a position of the first replication feature and the second substrate feature is aligned with a position of the second replication feature, and the first substrate feature and the second substrate feature have different heights.

Implementations of this or other methods may include one or more of the following features. A height of the first replication feature is smaller than a height of the second replication feature, and the plurality of etching processes including a first etching process that includes etching the replication material until the first replication feature is removed and a portion of the second replication feature remains on the multi-layer structure. The plurality of etching processes include a second etching process, performed after the first etching process, the second etching process including: etching away a portion of a hard mask layer of a first meta-layer, the etched-away portion of the hard mask layer aligned with the position of the first replication feature; and etching away a portion of a spacer layer of the first meta-layer, the etched-away portion of the spacer layer aligned with the position of the first replication feature and with a position of the etched-away portion of the hard mask layer of the first meta-layer. The second etching process causes a portion of the multi-layer structure aligned with the position of the first replication feature to include fewer meta-layers than a portion of the multi-layer structure aligned with the position of the second replication feature. The second etching process causes a portion of the multi-layer structure aligned with the position of the first replication feature to be thinner than a portion of the multi-layer structure aligned with the position of the second replication feature.

Implementations of this or other methods may include one or more of the following features. A first part of the plurality of etching processes causes the multi-layer structure to include a first portion and a second portion, the first portion thinner than the second portion. A second part of the plurality of etching processes includes etching the substrate to form a first intermediate substrate feature and a second intermediate substrate feature. The first intermediate substrate feature is aligned with the position of the first portion of the multi-layer structure and the second intermediate substrate feature is aligned with the position of the second portion of the multi-layer structure. The method includes, subsequent to etching the substrate to form the first and second intermediate substrate features: etching away the first portion of the multi-layer structure to expose the first intermediate substrate feature and to leave in place at least some of the second portion of the multi-layer structure; and etching away a portion of the first intermediate substrate feature, the second intermediate substrate feature being protected from etching by the second portion of the multi-layer structure. The method includes, subsequent to etching away the portion of the first intermediate substrate feature: etching away at least some of the second portion of the multi-layer structure; and etching the substrate to form the first substrate feature and the second substrate feature.

Implementations of this or other methods may include one or more of the following features. The method includes, subsequent to imprinting the replication pattern, etching away a residual layer of the replication material remaining on the surface of the multi-layer structure. The hard mask material is a metal or a metal oxide. The hard mask material includes chromium. The spacer material includes at least one of a photoresist, an oxide, or a nitride. The replication material includes at least one of a polymer, an epoxy, or a resin. The plurality of etching processes include a first etch that selectively etches the replication material compared to the hard mask material; a second etch that selectively etches the hard mask material compared to the spacer material; and a third etch that selectively etches the spacer material compared to the hard mask material. The plurality of etching processes include a first etch that selectively etches the substrate compared to the spacer material.

Implementations of this or other methods may include one or more of the following features. For example, in some instances, a number of the plurality of meta-layers equals or is greater than a number of substrate features formed by the plurality of etching processes, including the first substrate feature and the second substrate feature. In some implementations, the first replication feature adjoins the second replication feature, and the first substrate feature adjoins the second substrate feature. In some implementations, the first substrate feature and the second substrate feature together form some or all of an optical metastructure. In some cases, the first substrate feature and the second substrate feature together form some or all of a structure including a diffractive optical element (DOE), The substrate can have, for example, a refractive index of greater than 2.5 for at least one of ultraviolet light, visible light, or infrared light. Imprinting the replication pattern includes curing the replication material.

The disclosure also describes apparatuses. For example, the disclosure describes an apparatus including a substrate and a multi-layer structure disposed on the substrate. The multi-layer structure includes a plurality of meta-layers, each meta-layer including a hard mask layer including a metal or a metal oxide, and a spacer layer on which the hard mask layer is disposed, the spacer layer including at least one of a photoresist, an oxide, or a nitride.

Implementations of this or other apparatuses may include one or more of the following features. A replication material is disposed on the multi-layer structure. The replication material includes at least one of a polymer, an epoxy, or a resin. Each hard mask layer has a thickness between 10 nm and 50 nm. Each spacer layer has a thickness between 5 nm and 50 nm. Each hard mask layer includes chromium. The substrate has a refractive index of between 3.5 and 5.0 for at least one of infrared light, ultraviolet light, or visible light. The substrate includes a layer of a first material disposed on a second substrate comprising a second material.

Some embodiments of the subject matter described in this specification can be implemented to realize one or more of at least the following advantages. In some implementations, a pattern defined by imprinting can be transferred to a different material. In some implementations, a multi-level structure having a high refractive index can provide improved optical functionality. In some implementations, a given multi-level structure can be used flexibly to fabricate many different structures based on a low-cost, rapid imprinting process. In some implementations, faster and/or lower-cost etches can be used to produce multi-level structures. In some implementations, multi-level structures with arbitrary height differences can be produced.

The details of one or more implementations are set forth in the accompanying drawings and the description below. Other aspects, features and advantages will be apparent from the description and drawings, and from the claims.

DETAILED DESCRIPTION

Figure 1A:
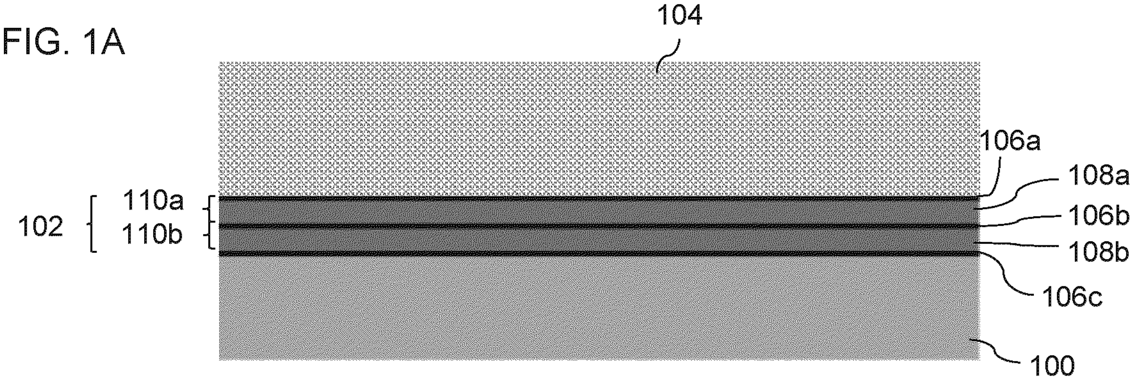
FIGS. 1A-1P are schematics showing an example of a fabrication process.
Figure 1A:

The present disclosure describes replication processes and devices. In certain implementations, this disclosure describes replication and etching processes to form multi-level structures in substrates.

Optical structures, which may include for example metalenses or diffractive optical elements, may be fabricated using a variety of methods. In some cases, the structure can be transferred, for example, to a curable resin by replication techniques.

In general, replication refers to a technique by means of which a given structure is reproduced, e.g., embossing or molding. In an example of a replication process, a structured surface is embossed into a liquid or plastically deformable material (a "replication material"), then the material is hardened, e.g., by curing using ultraviolet (UV) radiation or heating, and then the structured surface is removed. Thus, a negative of the structured surface (a replica) is obtained.

The replicated structure provides a mechanical, electrical, or optical functionality (or a combination of those functionalities) due to the structure imposed by the structured surface.

In some cases, replication may be implemented by stamping processes. In the case of a stamping process, which also may be referred to as an imprinting process, the structured surface is a surface of a stamp that is pressed into the liquid or plastically deformable material (or has the liquid or plastically deformable material pressed into it).

"Imprinting" or "replication," as used in this disclosure, may include other processes such as one or more of embossing, debossing, stamping, or nano-imprinting.

While in some implementations the liquid or plastically deformable material in a replication process is a bulk material (for example, a block of material), in other implementations the liquid or plastically deformable material is a layer or droplet (e.g., a coating) provided on a substrate surface.

While replication processes provide the possibility of low-cost and high-throughput, in some cases replication is less useful for forming high refractive index structures. Most (though not all) replication materials have low refractive indexes (e.g., refractive indexes less than 2.0). By contract, some materials unsuitable for direct imprinting have significantly higher refractive indexes. For example, silicon has refractive indexes greater than 3.5 for visible light, but cannot be imprinted under typical conditions.

In some cases, an imprinted replication material mask can be used directly as a mask for subsequent etching of a high refractive index material. However, some replication materials have relatively low etch selectivities compared to high refractive index materials, such that height variation in resulting multi-level structures in the high refractive index material is limited by height differences of features in replication material imprint patterns. Also, etching in such cases may be highly isotropic/lateral, leading to poor pattern transfer from the replication material to the high refractive index material.

High refractive index materials may be beneficial in optical devices. For example, the high refractive index may increase a strength of interactions between the optical device and light incident on, or generated by, the optical device, which may allow for stronger light redirection, detection, filtering, or other optical function performed by the optical device.

In accordance with implementations of this disclosure, multi-level structures are fabricated in high refractive index materials based on an imprinted pattern in a replication material.

FIG. 1A shows an example starting structure usable for multi-level structure fabrication. A replication material 104 is disposed on top of a multi-layer structure 102, which is itself disposed on a substrate 100.

The substrate 100, according to some implementations of this disclosure, is a high refractive index material. The substrate 100 may be, for example, a semiconductor substrate, e.g., silicon, gallium arsenide, germanium, or zinc selenide. In some implementations, the substrate 100 is an insulating substrate, e.g., diamond or an oxide (e.g., sapphire, a titanium oxide, or a silicon oxide). As noted above, many of these materials cannot be directly imprinted under typical conditions to form multi-level structures.

In some implementations, the substrate is an overall substrate that includes a layer of high refractive index material disposed on a first substrate of different material, the layer having the described multi-layer structure disposed on top of it. The substrate features may then be formed out of either or both of the layer of high refractive index material and the first substrate. For example, a top portion of a substrate feature may be the high refractive index material, and a bottom portion of the substrate feature may be the first substrate. In some implementations, the substrate features are formed entirely out of the layer of high refractive index material disposed on the first substrate.

In some implementations, the high refractive index material has a refractive index for visible light, ultraviolet light, and/or infrared light of at least 2.0, at least 2.5, at least 3.0, at least 3.5, or another value. The refractive index may be less than 4.0, less than 4.5, less than 5.0, or another value.

In some implementations, the replication material has a refractive index for visible light, ultraviolet light, and/or infrared light that is less than the refractive index of the substrate. In some implementations, the refractive index of the replication material may be less than 2.0, less than 2.5, less than 3.0, or another value.

The multi-layer structure 102 includes at least two types of layers. A first type of layer is a "hard mask layer." In the example of FIG. 1A, layers 106*a*, 106*b*, and 106*c* are hard mask layers. A second type of layer is a "spacer layer." In the example of FIG. 1A, layers 108*a* and 108*b* are spacer layers.

Hard mask layers are composed of one or more hard mask materials, and spacer layers are composed of one or more spacer materials. These materials can vary depending on the implementation, for example, depending on a type of replication material to be used, a type of substrate to be used, or types of etches to be used.

In some implementations, the replication material, the hard mask material, the spacer material, and the substrate can be defined in terms of relative etch selectivities. The selectivity of an etch refers to a ratio of depth etched per unit time in one material compared to another material; the etch is said to be "selective" for the material that is etched more, compared to the material that is etched less. For example, if a certain etch process (e.g., immersion in an etch solution at a given temperature) etches silicon at 100 nm/second, and the etch process has a selectivity of 2:1 in silicon compared to in silicon dioxide, then the same etch process etches silicon dioxide at 50 nm/second.

Selective etches, according to this disclosure, may have selectivities of at least 1.5:1, at least 2:1, at least 3:1, at least 5:1, at least 10:1, at least 50:1, at least 100:1, or another ratio. In some cases, an etch is entirely selective, e.g., etches a first material while essentially not etching a second material at all.

Under this formulation, a first etch type may selectively etch the hard mask material compared to the spacer material, the replication material, and/or the substrate. A second etch type may selectively etch the spacer material compared to the hard mask material, the replication material, and/or the substrate. A third etch type may selectively etch the replication material compared to the hard mask material, the spacer material, and/or the substrate. A fourth etch type may selectively etch the substrate compared to the hard mask material, the spacer material, and/or the replication material. This configuration of layer types and etch types can allow for selective layer-by-layer etching of the various layers of the starting structure showing in FIG. 1A.

However, each etch type not need be selective for one material compared to all other materials involved. Rather, while a first layer is being etched by an etch process, a second layer, etched less or not at all by the etch process, may mask a third layer that would be etched by the etch process, were it not for the presence of the masking second layer.

In some implementations, the hard mask material includes a metal. For example, the hard mask material may include chromium, aluminum, nickel, platinum, and/or another metal. In some implementations, the hard mask material includes a dielectric such as a metal oxide, e.g., aluminum oxide, titanium dioxide, hafnium oxide, and/or another dielectric.

In some implementations, each hard mask layer has a thickness between 10 nm and 50 nm, e.g., between 15 nm and 30 nm. Other thicknesses can also be used.

In some implementations, the spacer material includes one or more of a photoresist, an oxide, or a nitride. For example, the spacer material may include silicon dioxide, silicon nitride, aluminum oxide, and/or another material.

In some implementations, each spacer layer has a thickness between 5 nm and 100 nm, e.g., between 5 nm and 50 nm or between 10 nm and 35 nm. Other thicknesses can also be used.

The replication material 104 is a material capable of being patterned by a replication process. For example, the replication material 104 may include one or more of a polymer, a spin-on-glass, or any other material that may be structured in a replication process. Suitable materials for replication include, for example, hardenable (e.g., curable) polymer materials or other materials which are transformable in a hardening or solidification step (e.g., a curing step) from a liquid or plastically deformable state into a solid state. For example, in some implementations the replication material 104 is a UV-curable, microwave-curable, and/or thermally-curable epoxy or resin (e.g., a photoresist). In some implementations, the replication material 104 is transparent to visible and/or infrared light before and/or after curing.

Replication material may be provided on the multi-layer structure 102 using one or more of printing (e.g., inkjet printing), jetting, dispensing, screen printing, dip coating, or spin coating, or by another method. In some implementations, replication material is provided on a stamp and is then brought into contact with the multi-layer structure 102 as the stamp imprints the replication material.

The multi-layer structure 102 can be thought of as including multiple meta-layers 110*a*, 110*b*. Meta-layer 110*a* includes hard mask layer 106*a* and spacer layer 108*a*, whereas meta-layer 110*b* includes hard mask layer 106*b* and spacer layer 108*b*. A final hard mask layer 106*c*, not included in the meta-layers 110*a*, 110*b*, is on the substrate 100.

Note that the meta-layers also could be defined differently. For example, an equivalent description of the multi-layer structure 102 would be that a first meta-layer includes spacer layer 108*a* and hard mask layer 106*b*, a second meta-layer includes spacer layer 108*b* and hard mask layer 106*c*, and hard mask layer 106*a* underlies the replication material 104.

In some implementations, a number of meta-layers in the multi-layer structure 102 corresponds to a number of different heights for substrate features patterned using the multi-layer structure. For example, in the example of FIG. 1A, two meta-layers are present, which, as described in more detail below, allows for the fabrication of substrate features with two different heights. However, in some implementations, given N meta-layers, a number of different heights for resulting substrate features may be less than N, depending on the fabrication process.

Figure 1B:
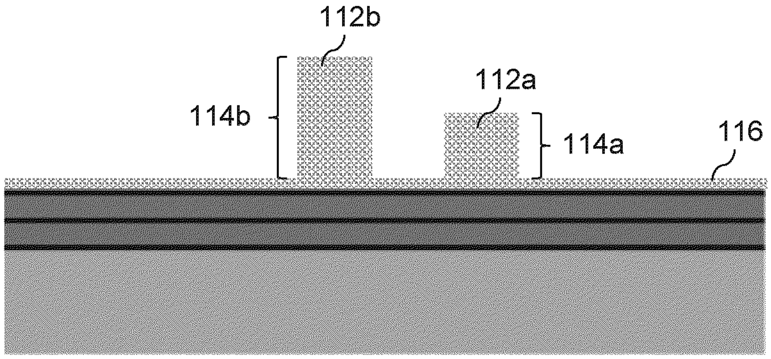
Figure 1B:
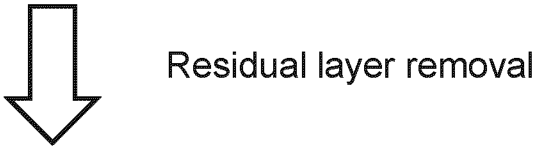
Figure 1C:
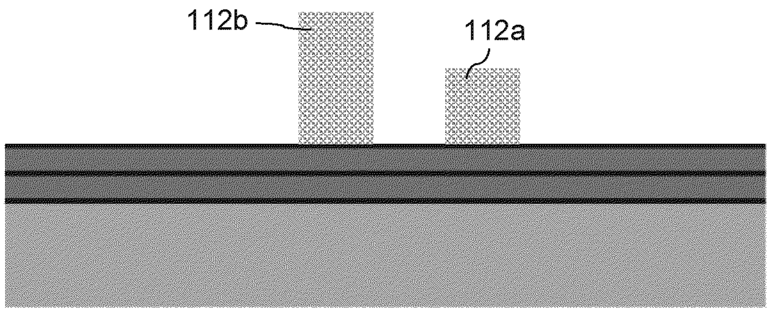
Figure 1G:
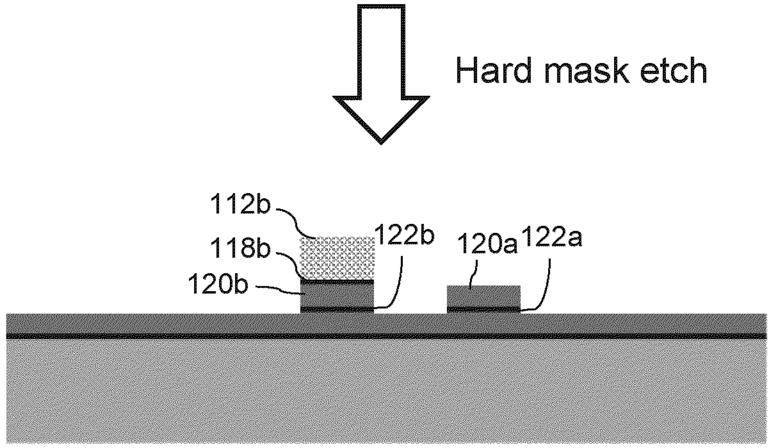
Figure 1H:
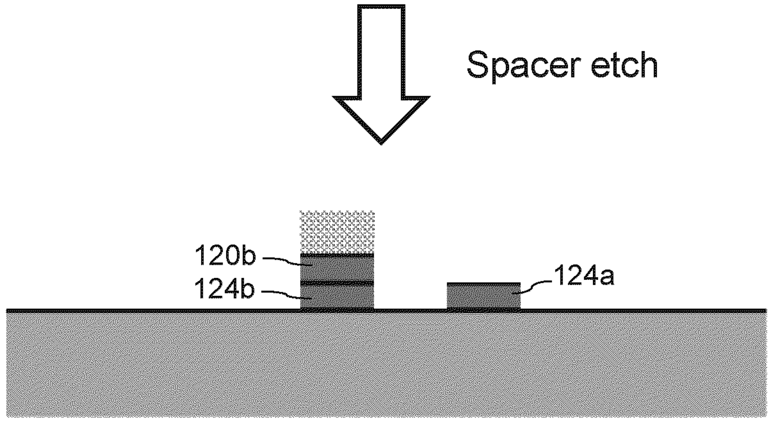
Figure 1I:
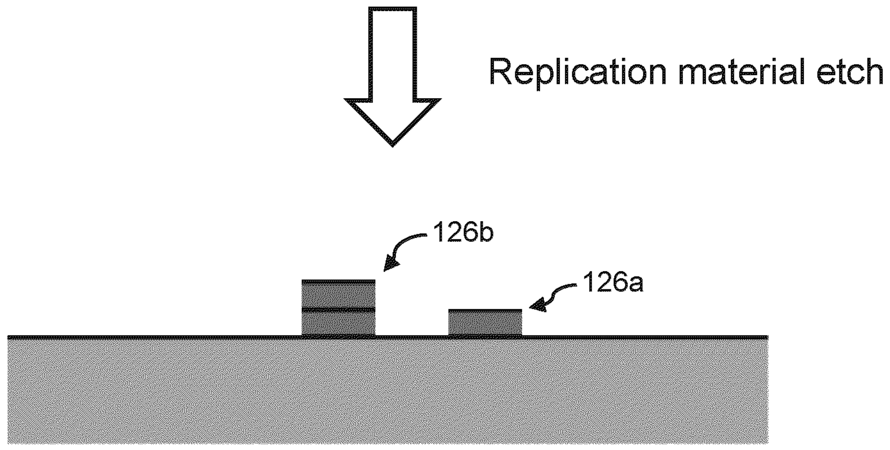
Figure 1J:
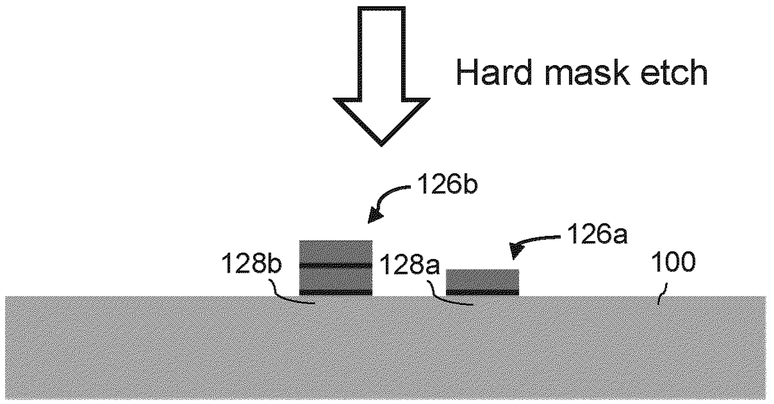
Figure 1K:
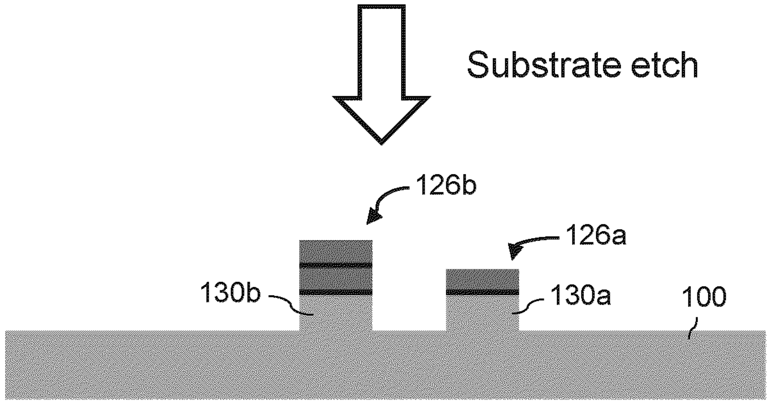
Figure 1L:
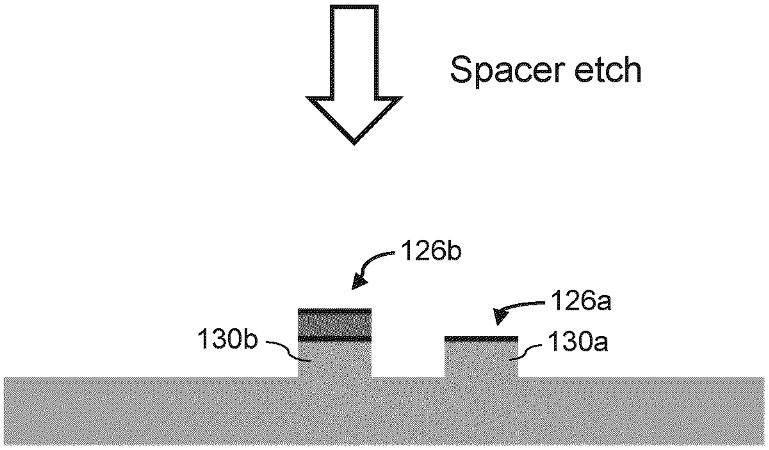
Figure 1M:
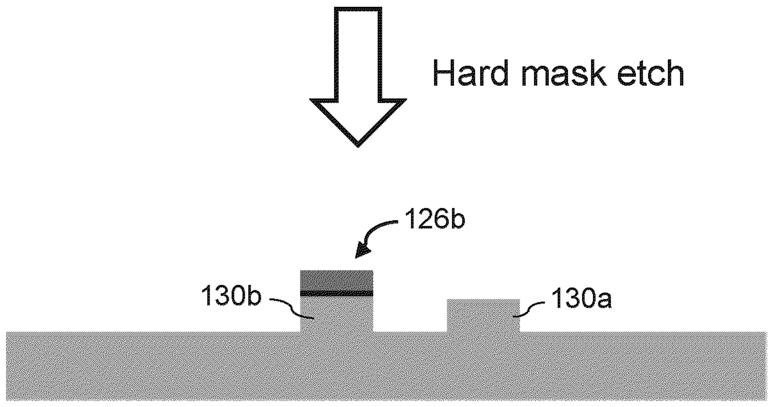
Figure 1N:
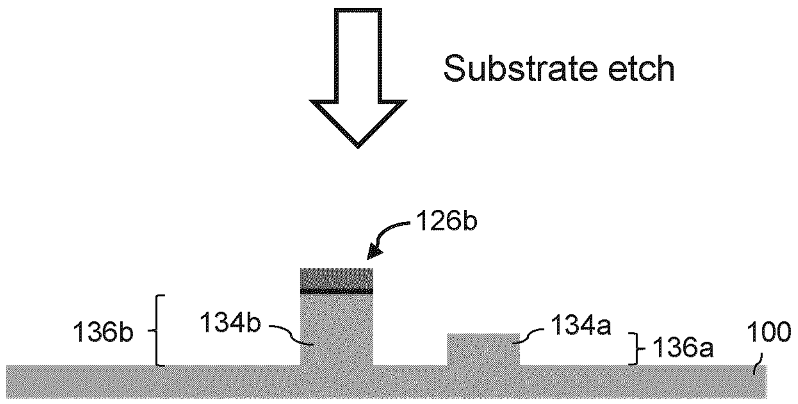
Figure 1O:
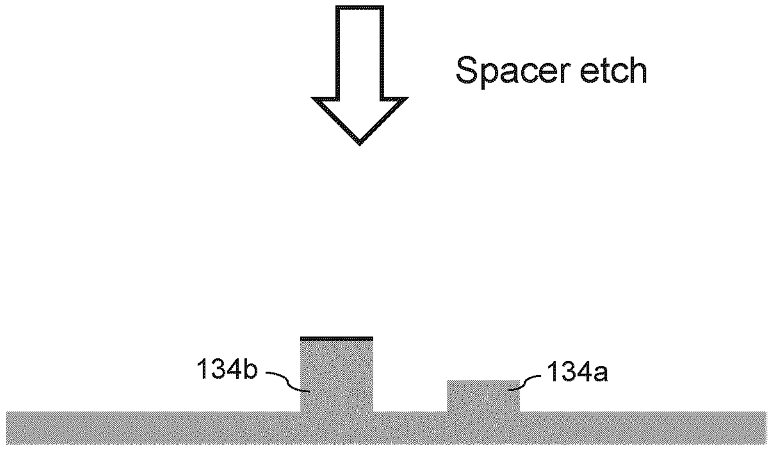
Figure 1P:
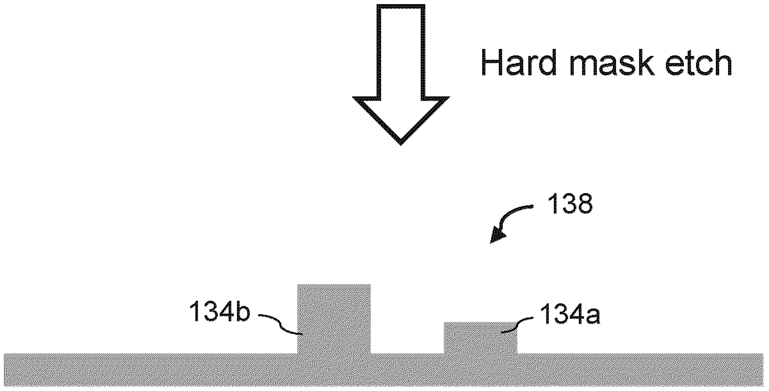

FIGS. 1B-1P illustrate an example fabrication process to produce a multi-level structure in the substrate 100 based on an imprinted pattern.

As shown in FIG. 1B, the replication material 104 is imprinted to form two replication features 112*a*, 112*b*. The two replication features 112*a*, 112*b* have different heights 114*a*, 114*b*, the different heights being defined by a geometry of a stamp, mold, or other structured surface used to imprint the replication material. In some implementations, a residual layer 116 of replication material (e.g., a residual layer 116 having a thickness between 10 nm and 100 nm) also remains in place, having not been completely removed by the imprinting. In this example, replication feature 112*b* is taller than replication feature 112*a*.

In some implementations, each height 114*a*, 114*b* is at least 100 nm, at least 200 nm, or another height. The each height 114*a*, 114*b* may be less than 1000 nm, less than 5000 nm, or another height. In some implementations, a difference between a height of a first replication feature and a second replication feature is between 50 nm and 200 nm.

Lateral dimensions of the replication features 112*a*, 112*b* may be, in some implementations, between 50 nm and 5000 nm, between 100 nm and 2000 nm, or another value.

The stamp or other structured surface (not shown) may be composed of a variety of materials, including a cured replication material and/or a patterned semiconductor wafer (e.g., a patterned silicon wafer), in some implementations including deposited metal layers. In some implementations, all or part of the stamp or other structured surface is transparent, e.g., is composed of glass. In some implementations, the stamp or other structured surface is thin and/or flexible, e.g., composed of polycarbonate foil. In some implementations, structured features of the stamp or other structured surface (such as a structured stamp surface having a structure corresponding to the imprinted replication features 112*a*, 112*b*) are composed of a polymer, e.g., PDMS.

In some implementations, the replication material 104 is cured during or after imprinting. For example, the replication material 104 may be cured while the stamp or other structured surface is in contact with the replication material 104, and/or the replication material 104 may be cured after the stamp or other structured surface has performed the imprinting and formed the replication features 112*a*, 112*b*. The curing may include a thermal cure, a UV cure, or both, or another curing method.

The curing may harden the replication features 112*a*, 112*b*, causing them to remain in place even after removal of the stamp. The curing may also, or additionally, chemically strengthen or alter the replication features 112*a*, 112*b*, causing them to withstand more strongly subsequent etching steps that are not intended to etch the replication material.

FIGS. 1A-1P show features in a side view, such that three-dimensional shapes of the features are not differentiated. In various implementations, replication features can have any of a variety of shapes. For example, replication features can include columns having circular, rectangular, or otherwise-shaped perimeters. Moreover, these shapes of the replication features correspond to resulting substrate features. For example, an imprinted replication feature that is a hexagonal column will lead to a hexagonal, columnar substrate feature. Different shapes of replication features can be combined to produce complex, multi-level substrate structures.

As shown in FIG. 1C, the residual layer 116 (if present) is removed. This may be performed using an etch selective to the replication material compared to the hard mask material. This etch can be configured to be short and/or to have a low etch rate, so as to remove the residual layer 116 while not removing significant amounts of the replication features 112*a*, 112*b*. In some implementations, this etch removes significant amounts of the replication features 112*a*, 112*b*, but leaves at least a portion of etch replication feature 112*a*, 112*b* in place and leaves replication feature 112*b* taller than replication feature 112*a*.

The type of etch used to remove the replication material (including the residual layer 116) selectively compared to the hard mask material depends on the specific types of those materials. In some implementations, this etch includes a plasma etch, e.g., an oxygen plasma etch. For example, the replication material may be etched using directional oxygen plasma using a high-vacuum tool or a barrel asher. In some implementations, a wet chemical etch is used. Replication material etches may have etch rates in the range of 0.5 nm/sec to 20 nm/sec, or another value.

In some implementations, the etch used to remove the replication material selectively is selective to the replication material compared to the spacer material and/or the substrate.

As shown in FIG. 1D, hard mask layer 106*a* is etched. This etch is selective to the hard mask material compared to the spacer material and compared to the replication material, such that the etch substantially terminates at spacer layer 108*a* and leaves replication material in place in the replication features 112*a*, 112*b*. Portions 118*a*, 118*b* of the hard mask layer 106*a* that are aligned with positions of the replication features 112*a*, 112*b* are masked by the replication features 112*a*, 112*b* and are correspondingly not significantly removed by the etch.

The type of etch used to remove the hard mask material selectively compared to the spacer material and the replication material depends on the specific types of those materials. For example, when the hard mask material includes chromium, the hard mask layer may be etched by a wet etch based on ceric ammonium nitrate. In some implementations, a plasma etch is used to etch the hard mask material, e.g., an inductively-coupled plasma etch with a chlorine/oxygen gas mixture. Metal hard mask materials may be plasma-etched using a chlorine-based chemistry, and metal oxide hard mask materials may be plasma-etched in a chlorine-based or fluorine-based chemistry. In some implementations, the hard mask material is etched using reactive ion etching and/or ion beam etching.

In some implementations, the etch used to remove the hard mask material selectively is selective to the hard mask material compared to the substrate.

As shown in FIG. 1E, spacer layer 108*a* is etched. This etch is selective to the spacer material compared to the hard mask material and compared to the replication material, such that the etch substantially terminates at hard mask layer 106*b* and leaves replication material in place in the replication features 112*a*, 112*b*. Portions 120*a*, 120*b* of the spacer layer 108*a* that are aligned with positions of the replication features 112*a*, 112*b* are masked by the replication features 112*a*, 112*b* and by remaining portions 118*a*, 118*b* of hard mask layer 106*a*, such that these portions 120*a*, 120*b* are correspondingly not significantly removed by the etch.

The type of etch used to remove the spacer material selectively compared to the hard mask material and the replication material depends on the specific types of these materials. In some implementations, the spacer material includes photoresist, and the spacer layer is etched by a wet etch in acetone or a specialized photoresist stripping solution. In some implementations, the spacer material includes an oxide, and the spacer layer is etched by a wet etch in an acid (e.g., hydrofluoric acid). In some implementations, the spacer material is etched by a plasma etch including a fluorine-based chemistry, e.g., a $C_4F_8/SF_6$ etch, a $CHF_3/SF_6/BCl_3$ etch, or an $O_2/SF_6$ etch, or another etch type.

In some implementations, the selective spacer material etch is selective to the spacer material compared to the substrate material.

As shown in FIG. 1F, the replication material is etched selectively to remove replication feature 112*a*. This etch is timed such that only a portion of replication feature 112*b* is removed. For example, if replication feature 112*a* is 500 nm tall, replication feature 112*b* is 1000 nm tall, and the etchant used to etch replication material etches at a rate of 20 nm/sec, then this etching step could involve a 30 second etch, to remove all of replication feature 112*a* and leave 400 nm of replication feature 112*b* in place.

This etch can be performed, for example, using an etching process as described in reference to FIG. 1C, or another etching process.

As shown in FIG. 1G, a selective hard mask layer etch is performed, e.g., as described in reference to FIG. 1D. This etch removes portion 118*a* of the hard mask layer 106*a* (no longer masked by replication material) along with areas of hard mask layer 106*b*. Portion 118*b* of the hard mask layer 106*a* is still masked by replication feature 112*b* and so is not significantly etched. Portions 122*a*, 122*b* of hard mask layer 106*b* are masked at least by, respectively, portions 120*a*, 120*b* of spacer layer 108*a*, and so similarly are not significantly etched.

As shown in FIG. 1H, a selective spacer etch is performed, e.g., as described in reference to FIG. 1E. This etch removes portion 120*a* of spacer layer 108*a* (no longer masked by hard mask material or replication material) along with areas of spacer layer 108*b*. Portion 120*b* of spacer layer 108*a* and portions 124*a*, 124*b* of spacer layer 108*b* are masked by hard mask material and/or replication material and are therefore not significantly etched.

As shown in FIG. 1I, a selective replication material etch is performed, as described in reference to FIG. 1C. This etch removes the remainder of replication feature 112*b*. In this example process, there are replication features of only two different heights, and so this etch results in the removal of all remaining replication material. However, various implementations can include replication features of one, three, four, or more different heights, such that the etch to remove a second-shortest replication feature is configured such that other replication features remain after the etch, as described above in reference to FIG. 1F.

At the process stage shown in FIG. 1F, the replication material has been removed. However, the replication features 112*a*, 112*b* defined by imprinting have resulted in corresponding structures being formed in the multi-layer structure 102. A remaining portion 126*a* of the multi-layer structure 102 is aligned with a (former) position of replication feature 112*a*, and another remaining portion 126*b* of the multi-layer structure 102 is aligned with a (former) position of replication feature 112*b*. Portion 126*a* includes one meta-layer and is thinner than portion 126*b*, which includes two meta-layers. The relative thicknesses/number of meta-layers in these portions 126*a*, 126*b* corresponds qualitatively to the relative heights of the replication features 112*a*, 112*b*: because replication feature 112*b* is thicker, some of replication feature 112*b* remains in place after replication feature 112*a* is fully etched away, and the remaining portion of replication feature 112*b* can act as an etch mask to protect more meta-layers of the multi-layer structure 102 from subsequent etches.

"Aligned," as used in this disclosure, can refer at least to the relative lateral positions of features with respect to a substrate surface on which the multi-layer structure is disposed. Each replication feature is aligned with a corresponding column of multi-layer structure and substrate that lie directly beneath the replication feature. A first structure and a second structure can be said to be "aligned" even if the first structure has been removed; in this case, the second structure is aligned with a former position of the first structure.

As shown in FIG. 1J, a selective hard mask layer etch is performed, e.g., as described in reference to FIG. 1D. This etch removes sections of hard mask layer 106*c* to expose underlying sections of substrate 100. Portions 128*a*, 128*b* of the substrate are masked, respectively, by overlying layers of remaining portions 126*a*, 126*b* of the multi-layer structure 102, and are therefore not significantly etched.

As shown in FIG. 1K, the substrate is etched selectively with respect to the spacer material. In some implementations, the substrate etch is selective with respect to the hard mask material. This etching creates two intermediate substrate features 130*a*, 130*b* based on masking by remaining portions 126*a*, 126*b* of the multi-layer structure 102.

The type of etch used to selectively remove the substrate compared to the spacer material and/or the hard mask material depends on the specific types of these materials. In some implementations, the substrate is a silicon substrate, and the selective substrate etch includes a KOH etch or another selective silicon wet etch. In some implementations, the selective substrate etch includes a plasma etch. For example, the plasma etch may include a fluorine-based chemistry such as a $C_4F_8/SF_6$ etch, a $CHF_3/SF_6/BCL_3$ etch, or an $O_2/SF_6$ etch.

Fluorine-based plasma etches may be particularly useful when a material (replication material, hard mask material, spacer material, or substrate material) includes silicon.

The intermediate substrate features 130*a*, 130*b*, which at this point in the fabrication process have the same height, are aligned with former positions of the replication features 112*a*, 112*b* and have thicknesses of multi-layer structure above them that corresponding to different heights of the imprinted replication features 112*a*, 112*b*. Equivalently, the intermediate substrate features 130*a*, 130*b* have different numbers of spacer layers above them (one and two, respectively), corresponding to relative heights of the imprinted replication features 112*a*, 112*b*. In some implementations, meta-layers are defined such that the intermediate substrate features 130*a*, 130*b* have different numbers of meta-layers above them (e.g., one and two, respectively).

FIGS. 1L and 1M show results of a selective spacer etch followed by a selective hard mask etch, e.g., as described in reference to FIGS. 1D-1E. Together, these etches remove the remaining portions of the multi-layer structure 102 that were masking intermediate substrate feature 130*a* (aligned with a former position of replication feature 112*a*), while portions of spacer layer 108*b* and 106*c* remain masking intermediate substrate feature 130*b* (aligned with a former position of replication feature 112*b*).

As shown in FIG. 1N, a selective substrate etch is performed, e.g., as described in reference to FIG. 1K. This etch etches unmasked portions of the substrate 100, including intermediate substrate feature 130*a*; intermediate substrate feature 130*b* is masked by the remaining portion 126*b* of the multi-layer structure 102 and is not significantly etched. Substrate features 134*a* and 134*b*, having different respective heights 136*a*, 136*b*, are produced by this etch. These substrate features 134*a*, 134*b* represent the desired multi-level structure.

Because intermediate substrate feature 130*a* is exposed to this second selective substrate etch along with surrounding portions of the substrate 100, the height 136*a* of substrate feature 134*a* matches or substantially matches a height of the intermediate substrate feature 130*a*. By contrast, because intermediate substrate feature 130*b* is masked during the second selective substrate etch while surrounding portions of the substrate 100 are not, substrate feature 134*b* is taller than intermediate substrate feature 130*b*. A duration of this etch determines the difference between substrate feature heights 136*a* and 136*b*.

Substrate features 134*a*, 134*b* are aligned, respectively, with replication features 112*a*, 112*b*, and have relative heights corresponding to the relative heights of replication features 112*a*, 112*b*. The initial imprinted replication features 112*a*, 112*b* have therefore led directly (through a sequence of selective etch steps) to corresponding features in the high refractive index substrate 100. It can be appreciated that appropriate selection of the multi-layer structure (e.g., a number of meta-layers included in the multi-layer structure) and appropriate configuration of the initial imprinting (which can be performed at relatively low-cost and with a high degree of flexibility based on the imprinting stamp/mold), followed by appropriate etch steps that, in some implementations, need not change appreciably based on variation in the formed replication features, can lead to an essentially unlimited variety of multi-level structures, subject to the conditions imposed in this example by the two-meta-layer multi-layer structure 102. For example, shapes of replication features will result in corresponding shapes of substrate features, and relative heights of replication features will result in corresponding relative heights of substrate features. Therefore, a high degree of process flexibility can be achieved.

Moreover, some or all of the selective etches may be relatively simple, low-cost, and/or rapid etches compared to other etches capable of forming multi-level structures in semiconductor substrate, e.g., Bosch deep reactive ion etches.

In addition, the material types of the spacer layers and hard mask layers can be selected in conjunction with etch methods for anisotropic, highly selective etching with precise pattern transfer from the replication features to the substrate features.

Subject to other limitations (e.g., non-ideal etch selectivities, mechanical limitations, substrate thickness, or other constraints), the processes described in this disclosure can lead to almost any desired height of substrate features and almost any desired difference in heights of substrate features. In this example, the height 136*a* of substrate feature 134*a* is set substantially or entirely by the first substrate etch described in reference to FIG. 1K (e.g., by a duration and etch rate of the etch). The height 136*b* of substrate feature 134*b* is set substantially or entirely by the second substrate etch described in reference to FIG. 1N, subject to the minimum height already imposed by the first substrate etch.

The heights 136*a*, 136*b* of the substrate features can depend, among other possible factors, on a desired function of the multi-level structure, on a material of the multi-level structure (e.g., a refractive index of the substrate material), and on lateral dimensions of the substrate features. When the multi-level structure has an optical functionality, the heights 136*a*, 136*b* may be similar to a wavelength of light on which the multi-level structure is configured to operate. For example, when the multi-level structure is integrated into a visible-light device, the heights 136*a*, 136*b* may be between 400 nm and 1000 nm. When the multi-level structure is integrated into a near infrared-light device, the heights 136*a*, 136*b* may be between 500 nm and 4000 nm. In some implementations, heights of substrate features are between 50 nm and 5000 nm.

In some implementations, a difference between heights of substrate features (e.g., a difference between heights 136*a* and 136*b*) is less than a wavelength of interest. In some implementations (e.g., when the multi-level structure is configured to interact with visible light), the height difference between a first substrate feature and a second substrate feature is between about 50 nm and 500 nm.

Optionally, as shown in FIGS. 1O and 1P, additional selective spacer layer and hard mask layer etches (e.g., as described in reference to FIGS. 1D-1E) can be performed to fully remove the multi-layer structure 102, leaving only the multi-level substrate structure 138 that includes substrate features 134*a* and 134*b*. The multi-layer substrate structure 138 may perform functions, for example, of an optical metastructure (e.g., a metalens) or a diffractive optical element, and/or may perform other functions. For example, the multi-layer substrate structure 138 may perform an electrical function (by itself or by integration with other components), may form microfluidic structures, and/or perform other functions.

In some implementations, each type of selective etch described in this disclosure (e.g., selective hard mask layers etches) is the same throughout a fabrication process. However, in some implementations, different etches or etch conditions (e.g., different chemicals and/or different chemical concentrations) may be used for different etches of a given type during a fabrication process.

In addition, etch steps need not be performed in the order and/or combination described in reference to FIGS. 1A-1P. For example, in some implementations a selective substrate etch is preceded by, rather than followed by, a spacer etch, with a hard mask layer (rather than a hard mask layer and a spacer layer) providing masking at a thinnest portion of the remaining multi-layer structure. In some implementations, two or more etch steps can be combined or performed simultaneously or at overlapping times.

In addition, multi-layer structures may include layers not shown in FIG. 1A, and/or may include layers in a different combination or order. For example, in some implementations a top layer or bottom layer of the multi-layer structure is a spacer layer rather than a hard mask layer.

The example multi-layer structure 102 shown in FIG. 1A includes two meta-layers (two spacer layers and three hard mask layers). In some implementations, a number of these meta-layers corresponds to a number of possible different heights of resulting substrate features, because each different substrate feature height corresponds to masking by a different respective combination of meta-layers. Multi-layer structures can include any number of meta-layers to produce multi-level structures with an equal or smaller number of substrate feature heights.

Figures 2A, 2B, 2C, 2D, 2E:
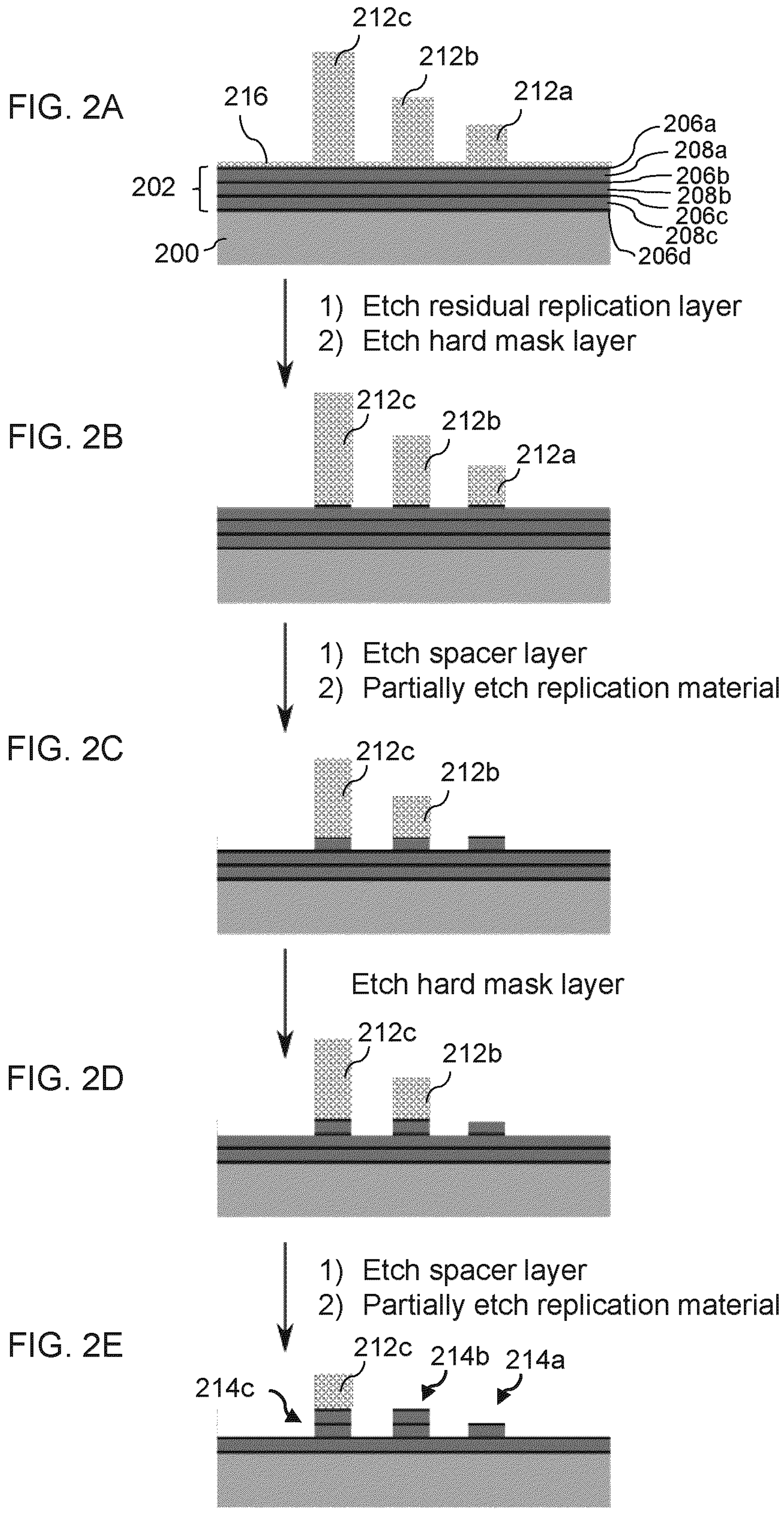
FIGS. 2A-2N are schematics showing an example of a fabrication process.

In accordance with this principle, FIGS. 2A-2C show an example fabrication process for a three-level substrate structure, based on a multi-layer structure having three layers. For conciseness, some portions of this process are not shown by a separate drawing. Unless indicated otherwise, the described layers, materials, processes, and etches may have the characteristics and relationships described for corresponding layers, materials, processes, and etches described in reference to FIGS. 1A-1P.

As shown in FIG. 2A, replication material is imprinted to form three replication features 212*a*, 212*b*, 212*c* having different respective heights. Replication feature 212*c* is taller than replication feature 212*b*, which is taller than replication feature 212*a*. In this example, a residual layer 216 of replication material remains in place. The replication material is disposed on a multi-layer structure 202 that includes three meta-layers, each meta-layer including a spacer layer and a hard mask layer. In total, the multi-layer structure 202 includes three spacer layers and four hard mask layers. The multi-layer structure 202 is disposed on a substrate 200.

The three spacer layers include a top spacer layer 208*a*, a middle spacer layer 208*b*, and a bottom spacer layer 208*c*. The four hard mask layers include a first hard mask layer 206*a*, a second hard mask layer 206*b*, a third hard mask layer 206*c*, and a fourth hard mask layer 206*d*.

As shown in FIG. 2B, the residual layer 216 of replication material is etched away (e.g., as described in reference to FIG. 1C), and the top hard mask layer 206*a* is etched away except for portions masked by replication features 212*a*, 212*b*, 212*c* (e.g., as described in reference to FIG. 1D).

As shown in FIG. 2C, the top spacer layer 208*a* is etched away except for portions masked by the top hard mask layer 206*a* and replication features 212*a*, 212*b*, 212*c* (e.g., as described in reference to FIG. 1E). The replication material is partly etched, such that replication feature 212*a* is removed and portions of replication features 212*b*, 212*c* are removed (e.g., as described in reference to FIG. 1F).

As shown in FIG. 2D, the first hard mask layer 206*a* and the second hard mask layer 206*b* are etched away except for masked portions (e.g., as described in reference to FIG. 1D. As shown in FIG. 2E, the top spacer layer 208*a* and the middle spacer layer 208*b* are etched away except for masked portions (e.g., as described in reference to FIG. 1E). As a result of this, the section 214*a* of the multi-layer structure 202 aligned with the former position of etched-away replication feature 212*a* is thinner than and includes one fewer meta-layers than sections 214*b*, 214*c* of the multi-layer structure aligned with the position of the preserved replication features 212*b*, 212*c*.

As also shown in FIG. 2E, the replication material is partly etched, such that replication feature 212*b* is removed and portions of replication features 212*c* are removed (e.g., as described in reference to FIG. 1F).

Figure 2F:
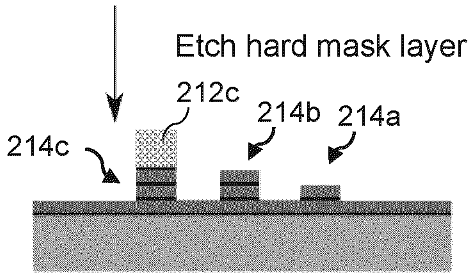
Figure 2G:
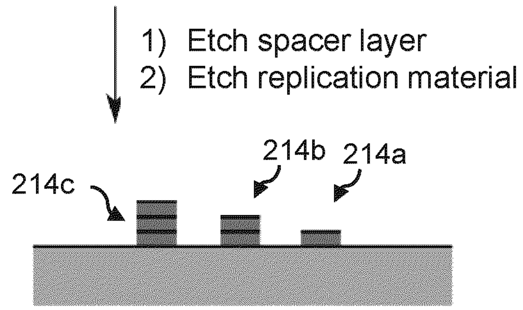

As shown in FIG. 2F, the first, second, and third hard mask layers 206*a*, 206*b*, 206*c* are etched away except for masked portions (e.g., as described in reference to FIG. 1D). As shown in FIG. 2G, the top spacer layer 208*a*, the middle spacer layer 208*b*, and the bottom spacer layer 208*c* are etched away except for masked portions (e.g., as described in reference to FIG. 1E). As a result, the section 214*a* of the multi-layer structure 202 aligned with a position of the shortest replication feature 212*a* is thinner than and includes one fewer meta-layers than the section 214*b* of the multi-layer structure 202 aligned with a position of the middle-height replication feature 212*b*. Also, the section 214*b* of the multi-layer structure 202 aligned with the position of the middle-height replication feature 212*b* is thinner than and includes one fewer meta-layers than the section 214*c* of the multi-layer structure 202 aligned with a position of the tallest replication feature 212*c*. Therefore, relative heights of the imprinted replication features 212*a*, 212*b*, 212*c* have been transferred to corresponding relative heights/meta-layer counts of the multi-layer structure 202.

As also shown in FIG. 2G, the remaining replication material (i.e., remaining portions of the replication feature 212*c*) are etched away (e.g., as described in reference to FIG. 1C).

Figure 2H:
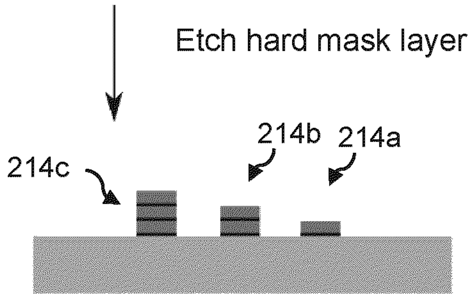

As shown in FIG. 2H, the first, second, third, and fourth hard mask layers 206*a*, 206*b*, 206*c*, 206*d* are etched away except for masked portions (e.g., as described in reference to FIG. 1D).

Figure 2I:
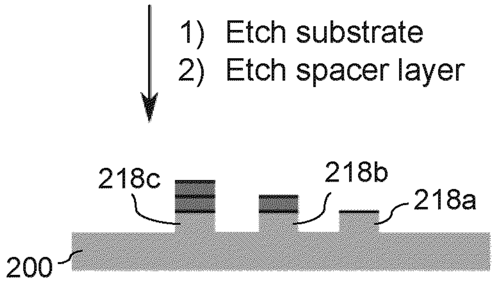

As shown in FIG. 2I, the substrate 200 is partially etched in a first substrate etch to form three first intermediate substrate features 218*a*, 218*b*, 218*c* defined by remaining masking portions of the multi-layer structure 202 (e.g., as described in reference to FIG. 1K). This etch defines a height of substrate feature 224*a* that will result from the fabrication process. As also shown in FIG. 2I, the top, middle, and bottom spacer layers 208*a*, 208*b*, 208*c* are etched away except for masked portions (e.g., as described in reference to FIG. 1E).

Figure 2J:
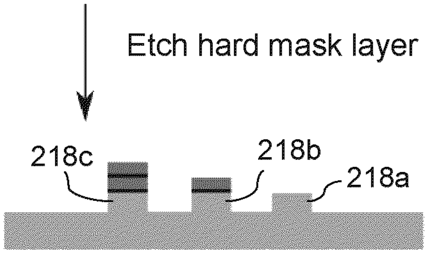

As shown in FIG. 2J, the second, third, and fourth hard mask layers 206*a*, 206*b*, 206*c* are etched away except for masked portions (e.g., as described in reference to FIG. 1D).

Figures 2K, 2L, 2M, 2N:
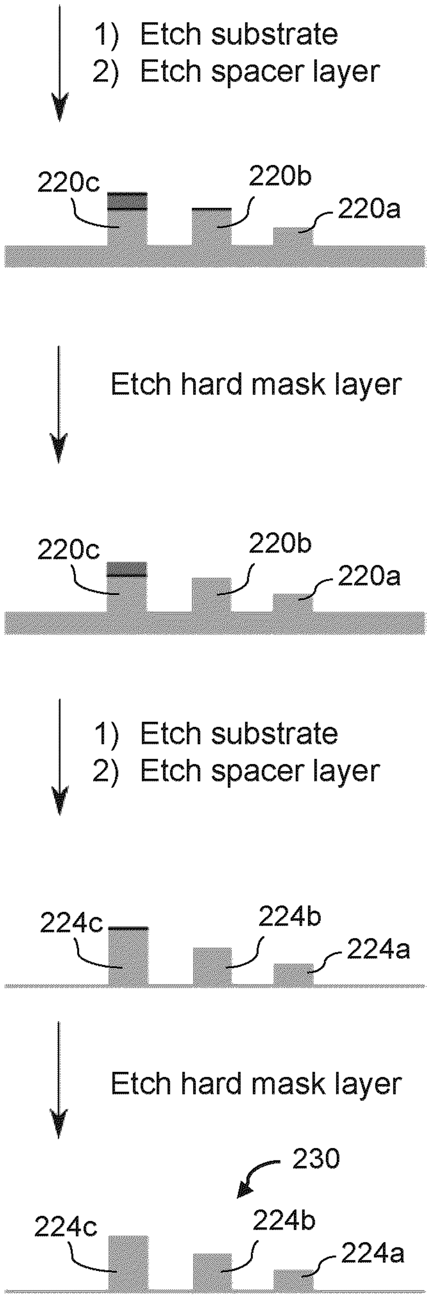

As shown in FIG. 2K, a second substrate etch is performed to form three second intermediate substrate features 220*a*, 220*b*, 220*c* based on the masking of first intermediate substrate features 218*b*, 218*c* and the lack of masking of first intermediate substrate feature 218*a* (e.g., as described in reference to FIG. 1K). This etch in combination with the first substrate etch defines a height of substrate feature 224*b* that will result from the fabrication process. As also shown in FIG. 2K, the middle and bottom spacer layers 208*b*, 208*c* are etched away except for a masked portion (e.g., as described in reference to FIG. 1E).

As shown in FIG. 2L, the third and fourth hard mask layers 206*c*, 206*d* are etched away except for a masked portion (e.g., as described in reference to FIG. 1D).

As shown in FIG. 2M, a third substrate etch is performed to form substrate features 224*a*, 224*b*, 224*c* based on the masking of first intermediate substrate feature 218*c* and the lack of masking of first intermediate substrate features 218*a*, 218*b* (e.g., as described in reference to FIG. 1K). This etch in combination with the first two substrate etches defines a height of substrate feature 224*c*. As also shown in FIG. 2M, remaining spacer material is etched away (e.g., as described in reference to FIG. 1E).

As shown in FIG. 2N, remaining hard mask material is etched away (e.g., as described in reference to FIG. 1D).

The resulting multi-level structure 230 includes substrate features 224*a*, 224*b*, 224*c* having three different heights, corresponding to the three different heights of the replication features 212*a*, 212*b*, 212*c* with which the substrate features 224*a*, 224*b*, 224*c* are respectively aligned and also corresponding to the three meta-layers included in the multi-layer structure 202. Both meta-layer count and number of imprinted heights can be increased to allow for more heights in the final multi-level structure.

In some embodiments according to this disclosure, an overall fabrication process can include two or more sub-processes that correspond to different combinations of etches. In some instances, the some of the sub-processes may at least partially overlap with one another.

For example, in some implementations a first sub-process includes i) partially etching replication material to remove a first replication feature without fully removing a second replication feature, ii) etching away a portion of an underlying hard mask layer, and iii) etching away a portion of an underlying spacer layer. Examples of this sub-process are shown, for example, in FIGS. 1E-1H, 2B-2E, and 2D-2G. As a result of this sub-process, a column of multi-layer structure aligned with a position of the first replication feature is made to include one fewer meta-layers than a column of multi-layer structure aligned with a position of the second replication structure.

In some implementations, a second sub-process includes i) performing a selective spacer etch, ii) performing a selective hard mask etch to cause a first portion of substrate to be exposed while a second portion of substrate is still masked, and iii) performing a selective substrate etch. Examples of this sub-process are shown, for example, in FIGS. 1K-1N, 2I-2K, and FIGS. 2K-2M. As a result of this sub-process, the first portion of the substrate is etched while the second portion of the substrate is not, leading to corresponding different substrate feature heights.

Figure 3:
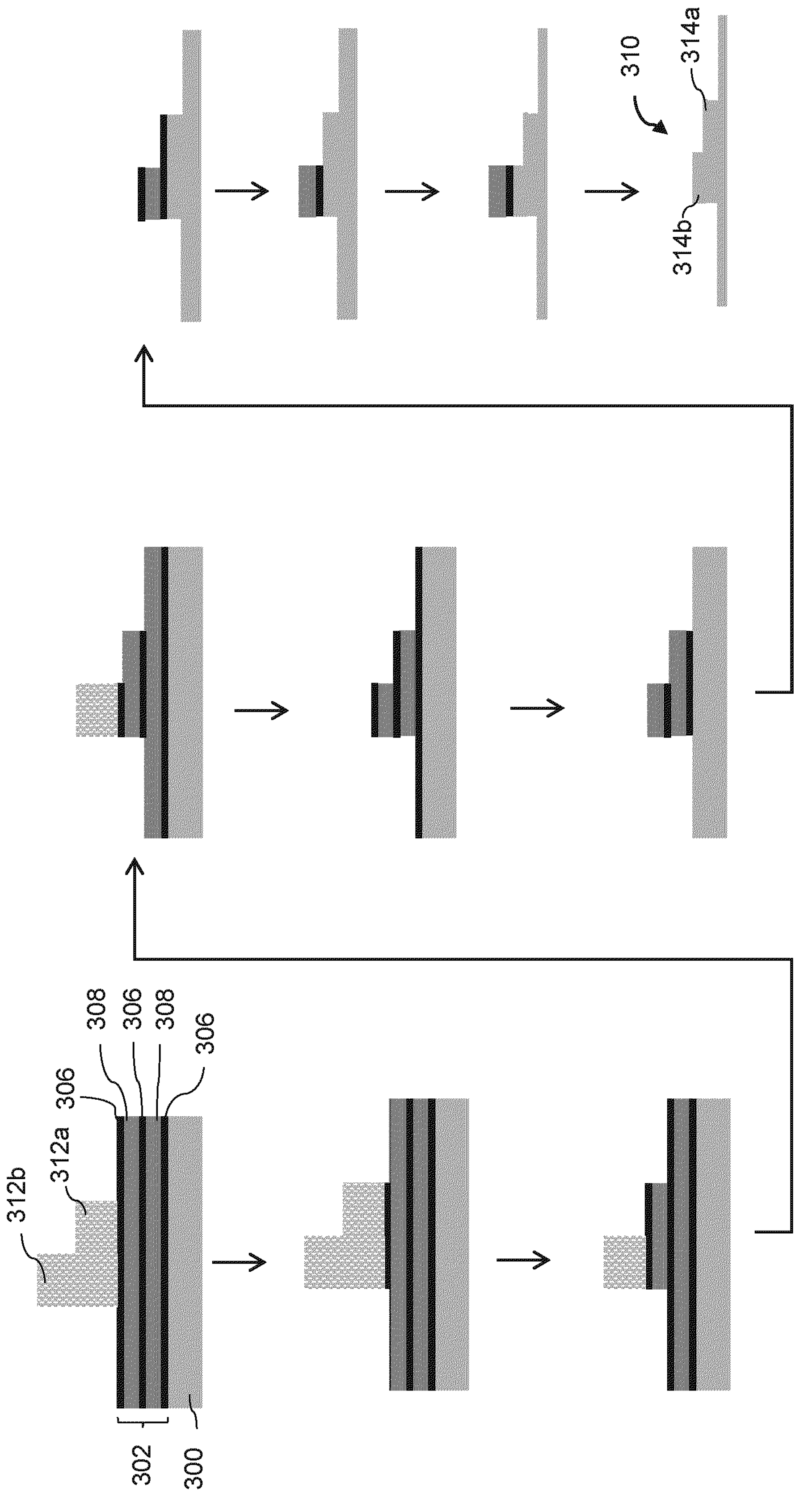
FIG. 3 is a set of schematics showing an example of a fabrication process.

FIG. 3 shows another example of fabrication of a multi-layer structure in a substrate. In this example, imprinted replication features are adjoining, which results in adjoining substrate features in a fabricated multi-level structure.

The example process of FIG. 3 is performed as described for the example process of FIGS. 1A-1P, except where indicated otherwise. Two adjoining replication features 312*a*, 312*b* of different heights are formed on a two-meta-layer multi-layer structure 302 disposed on a substrate 300. The multi-layer structure 302 includes three hard mask layers 306 and two spacer layers 308.

As described in reference to FIGS. 1A-1P, a sequence of etching steps is performed, as shown in stages in FIG. 3. The sequence of etching steps includes selective replication material etches as described in reference to FIG. 1C, selective hard mask material etches as described in reference to FIG. 1D, selective spacer material etches as described in reference to FIG. 1E, and selective substrate etches as described in reference to FIG. 1K. These etching steps result in the fabrication of a multi-level structure 310 in the substrate 300, the multi-level structure 310 including substrate features 314*a*, 314*b* having different heights. Because substrate features are aligned with positions of corresponding replication features, in this example the substrate features 314*a*, 314*b* are adjoining as were the replication features 312*a*, 312*b*. As described throughout this disclosure, relative heights of the replication features 312*a*, 312*b* correspond to relative heights of the substrate features 314*a*, 314*b*.

Different shapes, combinations, and heights of replication features correspond to different shapes, combinations, and heights of resulting substrate features after the performance of etching steps. FIGS. 4-6 show respective side and top views of multi-level substrate structures that can be fabricated according to embodiments of this disclosure.

Figure 4A:
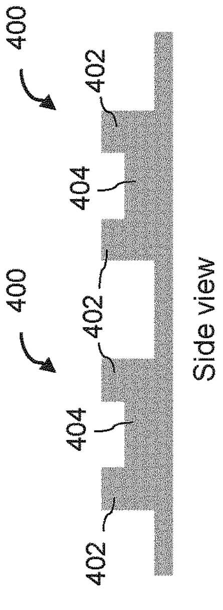
FIGS. 4A-4B are side and top views of an example multi-level structure.
Figure 4B:
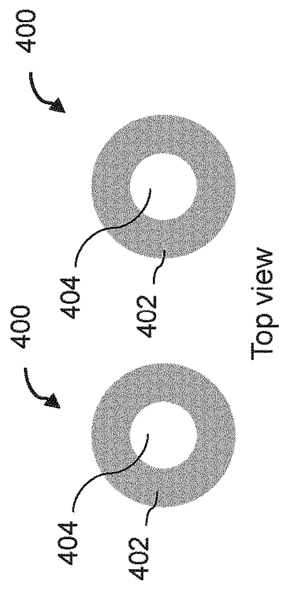

FIGS. 4A-4B show donut-shaped multi-level structures 400 with higher outer portions 402 and lower inner portions 404. These structures may be fabricated as a result of etching processes starting with two-level donut-shaped replication features, e.g., donut-shaped replication features with higher outer annular portions and lower enclosed inner portions corresponding to the multi-level structures 400. A stamp to imprint each replication structure might include an annular recess, a first protrusion inside the annular recess, and a second protrusion, extending out further than the first protrusion, surrounding the annular recess.

Figure 5A:
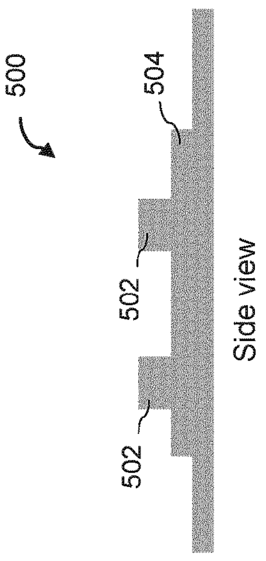
FIGS. 5A-5B are side and top views of an example multi-level structure.
Figure 5B:
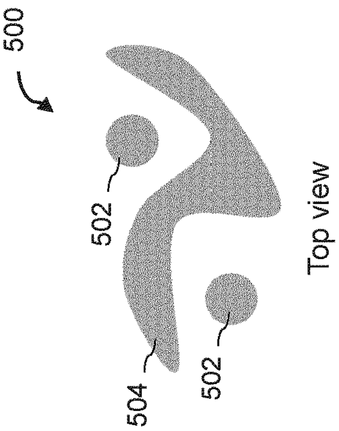

FIGS. 5A-5B show two elevated pillars 502 and a freeform shape 504, at a lower elevation than the two elevated pillars 502, that together form an overall multi-level structure 500. To form the multi-level structure 500, a layer of replication material can be imprinted with a stamp having two round recesses (to make two cylindrical replication features corresponding to the two elevated pillars 502) and a third recess that is less recessed than the two round recesses and has a shape matching the shape of the freeform shape 504. The resulting replication features are disposed on a multi-layer structure having at least two meta-layers, and a series of etching processes are carried out as described throughout this disclosure.

Figure 6A:
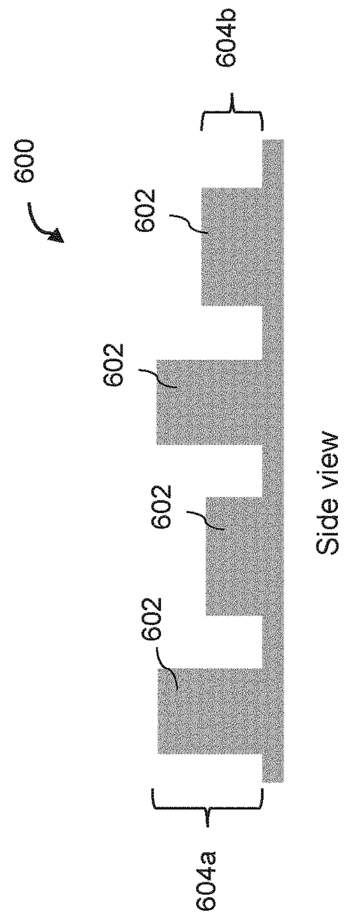
FIGS. 6A-6B are side and top views of an example multi-level structure.
Figure 6B:
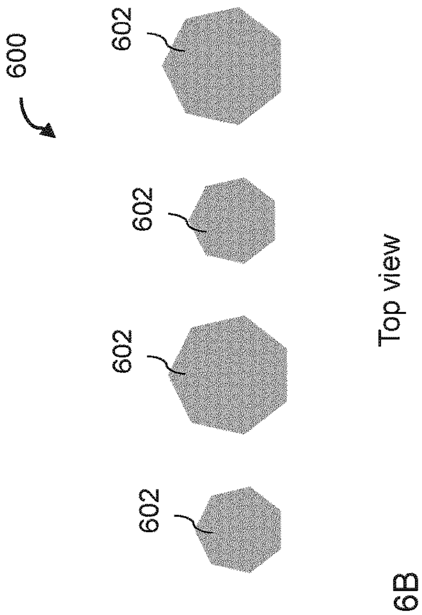

FIGS. 6A-6B show a multi-level structure 600 including four substrate features 602 of two heights 604*a*, 604*b*. Each substrate feature 602 is a seven-sided pillar. To form the multi-level structure 600, a layer of replication material may be imprinted with a stamp having four seven-sided recesses of two different depths corresponding to the two heights 604*a*, 604*b*, so as to imprint four seven-sided replication features. The resulting replication features are disposed on a multi-layer structure having at least two meta-layers, and a series of etching processes are carried out as described throughout this disclosure.

Figure 7:
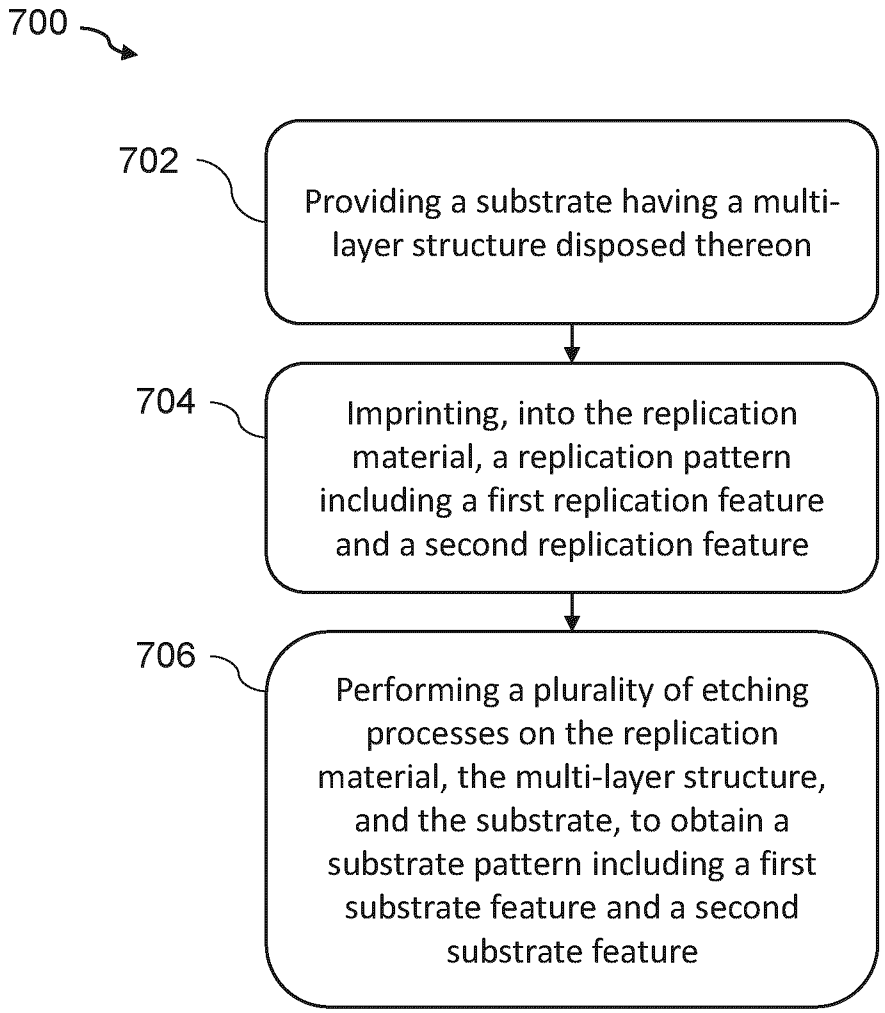
FIG. 7 is a flowchart showing an example process.

FIG. 7 shows an example process 700 in accordance with some implementations of this disclosure.

A substrate is provided having a multi-layer structure disposed thereon (702). The multi-layer structure includes a plurality of meta-layers, each meta-layer including a hard mask layer including a hard mask material, and a spacer layer on which the hard mask layer is disposed, the spacer layer including a spacer material. A replication material is disposed on a surface of the multi-layer structure.

A replication pattern including a first replication feature and a second replication feature is imprinted into the replication material (704). The first replication feature and the second replication feature have different heights.

A plurality of etching processes are performed on the replication material, the multi-layer structure, and the substrate, to obtain a substrate pattern including a first substrate feature and a second substrate feature (706). The first substrate feature is aligned with a position of the first replication feature and the second substrate feature is aligned with a position of the second replication feature. The first substrate feature and the second substrate feature have different heights.

The multi-level structures formed can have various functionalities. For example, the multi-level structures (e.g., including meta-layers) can form some or all of an optical structure that acts as a meta-optical element or a diffractive optical element such as a lens, lens array, beam splitter, diffuser, polarizer, bandpass filter, or other optical element. In some implementations, the multi-level structure can perform an anti-reflection functionality. For example, the multi-level structure may provide a metastructure that includes a surface with a distributed array of nanostructures or other meta-atoms that individually or collectively, interact with light waves to change a local amplitude, a local phase, or both, of an incoming light wave. In some implementations, the multi-level structure provides a diffractive optical element (DOE) that is operable to modify an incident light's phase and/or amplitude to create a desired optical output pattern with a specified functionality. The multi-level structures can be included, for example, in optical devices and modules, e.g., devices and modules to produce one or more of structured light, diffused light, or patterned light. The devices and modules may be part of, for example, time-of-flight cameras or active-stereo cameras. The devices and modules may be integrated into systems, for example, mobile phones, laptops, television, wearable devices, or automotive vehicles.

When the multi-level structure provides an optical functionality, in some implementations a relatively high refractive index of the multi-level structure compared to typical refractive indices of replication materials may provide improved optical functionality.

In some implementations, the multi-level structure can provide a hydrophilic or hydrophobic functionality. Other types of structures and functionalities can also be formed or provided.

In this disclosure, references to refractive indices refer to values of these properties at room temperature (e.g., 25° C.).

Therefore, in accordance with the implementations of this disclosure, the fabrication of multi-level structures is described.

Various modifications will be apparent from the foregoing detailed description. Further, features described above in connection with different implementations may, in some cases, be combined in the same implementation. In some instances, the order of the process steps may differ from that described in the particular examples above.

Accordingly, other implementations are also within the scope of the claims.

What is claimed is:

1. A method comprising:

providing a substrate having a multi-layer structure disposed thereon, wherein the multi-layer structure comprises a plurality of meta-layers stacked in sequence, each meta-layer comprising a hard mask layer comprising a hard mask material, and a spacer layer on which the hard mask layer is disposed, the spacer layer comprising a spacer material, wherein the hard mask material of the hard mask layer of each of the plurality of meta-layers comprises a same first material, wherein the spacer material of the spacer layer of each of the plurality of meta-layers comprises a same second material, and wherein a replication material is disposed on a surface of the multi-layer structure;

imprinting, into the replication material, a replication pattern comprising a first replication feature and a second replication feature, wherein the first replication feature and the second replication feature have different heights; and performing a plurality of etching processes on the replication material, the multi-layer structure, and the substrate, to obtain a substrate pattern comprising a first substrate feature and a second substrate feature, wherein the first substrate feature is aligned with a position of the first replication feature and the second substrate feature is aligned with a position of the second replication feature, and wherein the first substrate feature and the second substrate feature have different heights.

2. The method of claim 1, wherein a height of the first replication feature is smaller than a height of the second replication feature, and wherein the plurality of etching processes comprise a first etching process comprising:

etching the replication material until the first replication feature is removed and a portion of the second replication feature remains on the multi-layer structure.

3. The method of claim 2, wherein the plurality of etching processes comprise a second etching process, performed after the first etching process, the second etching process comprising:

etching away a portion of a hard mask layer of a first meta-layer, the etched-away portion of the hard mask layer aligned with the position of the first replication feature; and etching away a portion of a spacer layer of the first meta-layer, the etched-away portion of the spacer layer aligned with the position of the first replication feature and with a position of the etched-away portion of the hard mask layer of the first meta-layer.

4. The method of claim 3, wherein the second etching process causes a portion of the multi-layer structure aligned with the position of the first replication feature to include fewer meta-layers than a portion of the multi-layer structure aligned with the position of the second replication feature.

5. The method of claim 3, wherein the second etching process causes a portion of the multi-layer structure aligned with the position of the first replication feature to be thinner than a portion of the multi-layer structure aligned with the position of the second replication feature.

6. The method of claim 2, wherein the first replication feature adjoins the second replication feature, and wherein the first substrate feature adjoins the second substrate feature.

7. The method of claim 1, wherein a first part of the plurality of etching processes causes the multi-layer structure to include a first portion and a second portion, the first portion thinner than the second portion, and wherein a second part of the plurality of etching processes comprises:

etching the substrate to form a first intermediate substrate feature and a second intermediate substrate feature, wherein the first intermediate substrate feature is aligned with the position of the first portion of the multi-layer structure and the second intermediate substrate feature is aligned with the position of the second portion of the multi-layer structure.

8. The method of claim 7, comprising, subsequent to etching the substrate to form the first and second intermediate substrate features:

etching away the first portion of the multi-layer structure to expose the first intermediate substrate feature and to leave in place at least some of the second portion of the multi-layer structure; and etching away a portion of the first intermediate substrate feature, the second intermediate substrate feature being protected from etching by the second portion of the multi-layer structure.

9. The method of claim 8, comprising, subsequent to etching away the portion of the first intermediate substrate feature:

etching away at least some of the second portion of the multi-layer structure; and etching the substrate to form the first substrate feature and the second substrate feature.

10. The method of claim 1, comprising, subsequent to imprinting the replication pattern, etching away a residual layer of the replication material remaining on the surface of the multi-layer structure, wherein the replication material comprises at least one of a polymer, an epoxy, or a resin, and wherein imprinting the replication pattern comprises curing the replication material.

11. The method of claim 1, wherein the hard mask material is a metal or a metal oxide.

12. The method of claim 11, wherein the hard mask material comprises chromium.

13. The method of claim 1, wherein the spacer material comprises at least one of a photoresist, an oxide, or a nitride.

14. The method of claim 1, wherein the plurality of etching processes comprise:

a first etch that selectively etches the replication material compared to the hard mask material;

a second etch that selectively etches the hard mask material compared to the spacer material; and a third etch that selectively etches the spacer material compared to the hard mask material.

15. The method of claim 1, wherein the first replication feature adjoins the second replication feature, and wherein the first substrate feature adjoins the second substrate feature.

16. The method of claim 1, wherein the first substrate feature and the second substrate feature together form some or all of an optical metastructure.

17. The method of claim 1, wherein the substrate has a refractive index of greater than 2.5 for at least one of ultraviolet light, visible light, or infrared light.

18. The method of claim 1, wherein performing the plurality of etching processes on the replication material, the multi-layer structure, and the substrate comprises:

forming the multi-layer structure into a meta-layer pattern comprising a plurality of pattern features, wherein each respective pattern feature is aligned with a position of a respective one of replication features imprinted into the replication pattern, and wherein the pattern features have different respective numbers of meta-layers from one another.

19. The method of claim 1, wherein a number of the plurality of meta-layers equals or is greater than a number of different heights for substrate features formed by the plurality of etching processes.

20. The method of claim 1, wherein the plurality of etching processes comprise a first etch that selectively etches the substrate compared to the spacer material.

* * * * *